United States Patent
Pierick et al.

(10) Patent No.: US 8,559,903 B2
(45) Date of Patent: Oct. 15, 2013

(54) FEEDFORWARD AUTOMATIC GAIN CORRECTION

(75) Inventors: Henk Ten Pierick, Sonen Breugel (NL); Gertjan Groot Hulze, Eindhoven (NL); Erik Keukens, Eindhoven (NL)

(73) Assignee: NXP B.V., Eindhoven (NL)

( * ) Notice: Subject to any disclaimer, the term of this patent is extended or adjusted under 35 U.S.C. 154(b) by 76 days.

(21) Appl. No.: 13/299,581

(22) Filed: Nov. 18, 2011

(65) Prior Publication Data

US 2012/0129478 A1 May 24, 2012

(30) Foreign Application Priority Data

Nov. 24, 2010 (EP) .................................. 10192397

(51) Int. Cl.
*H04B 1/06* (2006.01)
*H04B 7/00* (2006.01)

(52) U.S. Cl.
USPC ......... 455/240.1; 455/323; 455/334; 375/345

(58) Field of Classification Search
USPC ........ 455/230, 232.1, 234.1, 240.1, 313, 323, 455/334, 338–341; 375/345
See application file for complete search history.

(56) References Cited

U.S. PATENT DOCUMENTS

| 6,556,685 | B1 | 4/2003 | Urry et al. |
| 2006/0159200 | A1* | 7/2006 | Hsu et al. ................. 375/316 |

FOREIGN PATENT DOCUMENTS

| EP | 1 172 932 A2 | 1/2002 |
| EP | 1 213 832 A1 | 6/2002 |
| EP | 1 315 292 A1 | 5/2003 |

OTHER PUBLICATIONS

Extended European Search Report for Patent Appln. No. 10192397.7 (Apr. 6, 2011).

* cited by examiner

*Primary Examiner* — Nhan Le

(57) ABSTRACT

An automatic gain control circuit is provided for an input signal in the form of a dc reference level and a superposed amplitude modulated ac data signal. A feedforward AGC loop has a low pass filter for deriving the level of attenuation from the attenuated dc reference level. A multiplier value (G) is based on the reciprocal of the level of attenuation ($\alpha$) and this multiplier enables an output signal to be generated comprising a constant multiple (DG) of the input signal.

18 Claims, 3 Drawing Sheets

FEEDFORWARD AUTOMATIC GAIN CORRECTION

This application claims the priority under 35 U.S.C. §119 of European patent application no. 10192397.7, filed on Nov. 24, 2010, the contents of which are incorporated by reference herein.

FIELD OF THE INVENTION

This invention relates to a feedforward automatic gain correction circuit and method, and particularly for use within an amplitude modulation system.

BACKGROUND OF THE INVENTION

Automatic gain correction (AGC) is used to compensate for the signal attenuation in a signal transmission path between a transmitter and a receiver, so that the receiver can provide a constant output level in the presence of this varying input signal level.

Conventional AGC circuits typically employ feedback techniques.

FIG. 1 of the accompanying drawings is a block schematic diagram of a simplified radio receiver and illustrates a classical radio frequency (RF) AGC system.

An antenna 10 is coupled to a gain controlled RF amplifier 12. An output of the RF amplifier 12 is coupled to a simplified frequency down-conversion stage 14 in which a received RF signal is frequency down-converted to base band and applied to a signal processor 16 which generates the audio output. The architecture of the frequency down-conversion stage 14 can be of any suitable design known in the art and for the purpose of illustration comprises a superheterodyne stage comprising a mixer 18 having inputs for the output of the RF amplifier 12 and a local oscillator 20, respectively.

A bandpass filter 22 is coupled to an output of the mixer 18 to select the desired signal from the products of mixing. A baseband or audio frequency gain controlled amplifier 24 has an input coupled to an output of the bandpass filter 22 and an output coupled to an input of the signal processor 16.

The purpose of AGC is to adjust automatically the gain of the receiver such as to enable the receiver to deliver an adequate level of signal to the input of the signal processor 16.

In the circuit illustrated in FIG. 1, automatic gain control is applied to the RF amplifier 12 and to the baseband amplifier 24. The signal received at the antenna 10 is a broadband signal shown by the inset drawing (of power versus frequency), the broadband signal includes the desired signal $F_W$ and unwanted signals in adjacent bands. The total power received from the antenna at an input of the RF amplifier 12 is Ptot. The power of the amplified broadband signal at the output of the RF amplifier 12 is Pout and this power is detected at the output of the amplifier 12 using a power detector 26. The power detector 26 produces an output Pdet which is applied to one input of a comparator 28. A threshold stage 30 is connected to a second input of the comparator 28 and provides a threshold value against which Pdet is compared. The threshold value is selected to maximise the gain of the RF amplifier 12.

An output of the comparator 28 is coupled to an integrator 32 which has an output coupled to a control input 13 of the RF amplifier 12. In operation, if Pdet exceeds the threshold value then the AGC circuit reduces the gain of the RF amplifier 12 and conversely if Pdet is less than the threshold value the AGC circuit increases the gain of the RF amplifier 12. This process continues with the objective of adjusting the gain until Pdet equals the threshold. In practice, Pout is regulated in order to avoid overloading the stages following the RF amplifier 12, in this illustrated case, the frequency down-conversion stages.

The base band amplifier 24 receives a narrowband signal, shown inset, comprising the desired signal $F_W$ and, possibly, residues $F_R$ from the adjacent channels depending on the quality of filtering by the bandpass filter 22 and provides an amplified constant level output signal to the signal processor 16.

In order to control the gain of the baseband amplifier, an output derived from the signal processor 16 is applied to a control input 25 of the base band amplifier 24 in order to keep its output constant.

In the case of frequency modulation, the signal processor performs frequency demodulation. In the case of amplitude modulation, the signal processor processes the baseband signal which itself comprises the original signal which was modulated onto the carrier.

The circuit of FIG. 1 is used to illustrate the feedback nature of AGC control loops. This invention relates in particular to amplitude modulated signals, and in particular after the frequency down-conversion of the signal has been carried out. Thus, the invention concerns the baseband gain control.

An issue with feedback circuits of this type is that the settling speed may be compromised by ensuring loop stability. In particular, it is difficult to ensure fast response without oscillation or a large distortion figure. In general, this means that the gain control loop filter can only have a low order.

The filtering that can be implemented in the gain control loop is limited by the desired response time. As the strength of inter-modulation is directly related to the amount of audio content in the case of AM radio, strong filtering is also required in determining the gain.

There is therefore a need for a system in which the filtering required to determine the desired gain can be freely selected, thereby resulting in a system where a low distortion can be ensured. By enabling a freely selectable filter, the bandwidth/speed of the filter can be changed without concern for the loop gain.

This invention relates particularly to amplitude modulation signal broadcast. In this type of system, a dc component is often transmitted with a certain modulation index. This dc component is used to ensure low noise at low modulation.

SUMMARY OF THE INVENTION

According to the invention, there is provided an automatic gain control circuit, comprising:
an input for receiving a variably attenuated input signal, the input signal comprising a dc reference level and a superposed ac data signal;
a feedforward path comprising:
a low pass filter for deriving the level of attenuation from the attenuated dc reference level; and
a unit for deriving a multiplier value, based on the reciprocal of the level of attenuation;
a multiplier for multiplying the variably attenuated input signal with the multiplier value to derive an output signal comprising a constant multiple of the input signal.

The invention is based on the recognition that the dc reference level (the carrier for the amplitude modulation) can be used as a reference to determine the received signal strength.

The circuit essentially normalizes the dc reference level signal strength, which in turn means the transmitted volume will be received independently of the signal strength. In principle, the incoming signal has to be multiplied by the reciprocal of the dc reference level signal strength to provide an audio volume that is independent of the signal strength.

The signal strength can not be directly measured as the signal is amplitude modulated on the dc reference. Thus, low pass filtering is required to enable the carrier to be processed in isolation.

The multiplier preferably comprises a desired gain multiplied by the reciprocal of the level of attenuation.

The desired gain can comprise:

DG=$V$max/(RefDC+PMmax)

wherein Vmax is the maximum desired output voltage, RefDC is the dc reference voltage level and PMmax is the maximum input signal resulting when the maximum positive modulation is superposed on the dc reference voltage level.

This provides an output signal which does not exceed the desired level Vmax. The desired gain can be in the range 0.3 to 0.5. For example, if Vmax=RefDC and a maximum positive modulation of 160% is allowed, then G=0.38.

The multiplier preferably comprises a variable gain amplifier.

In some applications, such as car radios, the signal strength can quickly vary. This means that the minimum bandwidth of the gain determination (i.e. the cut off frequency of the low pass filter) needs to be relatively high, so that the low pass filter does not filter out these changes in signal level. However, a low cut off frequency is desired in order to reduce inter-modulation between the incoming signal and the low pass filtered signal.

Thus, the circuit can comprise means for controlling the low pass filter in response to sudden changes in the variable attenuation. This means for controlling the low pass filter preferably comprises a means for varying the cut-off frequency of the low pass filter. Thus, a tunable low pass filter is used, which is tuned in response to the need for more rapid response to the attenuation changes in the input signal.

The invention also provides a car radio receiver circuit comprising an automatic gain control circuit of the invention for deriving an output signal from a variably attenuated input signal.

The invention also provides an automatic gain control method, comprising:

receiving a variably attenuated input signal, the input signal comprising a dc reference level and a superposed ac data signal;

low pass filtering the variably attenuated input signal, for deriving the level of attenuation from the attenuated dc reference level;

deriving a multiplier value, based on the reciprocal of the level of attenuation; and multiplying the variably attenuated input signal with the multiplier value to derive an output signal comprising a constant multiple of the input signal.

BRIEF DESCRIPTION OF THE DRAWINGS

The invention will now be described in detail with reference to the accompanying drawings, in which.

DETAILED DESCRIPTION OF EMBODIMENTS

The invention provides an automatic gain control circuit for an input signal in the form of a dc reference level and a superposed (amplitude modulated) ac data signal. A feedforward AGC loop has a low pass filter for deriving the level of attenuation from the attenuated dc reference level. A multiplier value is based on the reciprocal of the level of attenuation and this multiplier enables an output signal to be generated comprising a constant multiple of the input signal.

The output signal of an AM demodulator preferably has an audio output level which is independent of the attenuation.

The input signal (which is modulated onto a radio frequency carrier of desired frequency) is given by:

$$T(s)=\alpha(S(t)+1) \quad [1]$$

The value $\alpha$ represents the level of variable attenuation which has been suffered by the original audio signal. The original input signal comprises a dc reference level (the 1) and a superposed amplitude modulated ac data signal (the S(t)).

The value $\alpha$ in equation [1] has to be removed from the equation and transformed into a fixed value in order to obtain independence of the attenuation.

The desired output is DG·(S(t)+1), where DG=0.35 in one example.

The value of desired gain DG is derived from:

$$DG=V\text{max}/(\text{RefDC}+\text{PMmax}) \quad [2]$$

wherein Vmax is the maximum desired output voltage, RefDC is the dc reference voltage level (which was given as 1 in equation [1]) and PMmax is the maximum input signal resulting when the maximum positive modulation is superposed on the dc reference voltage level.

In one example case, the maximum output level is 1, and the positive modulation is at most 160%. This leads to a value of G=0.38, and a choice of G=0.35 offers a head room of approximately 10%.

The average of the ac signal S(t) is zero. This means that with a lowpass filter, the amplitude of $\alpha$ can be determined from T(s).

Figure 1:
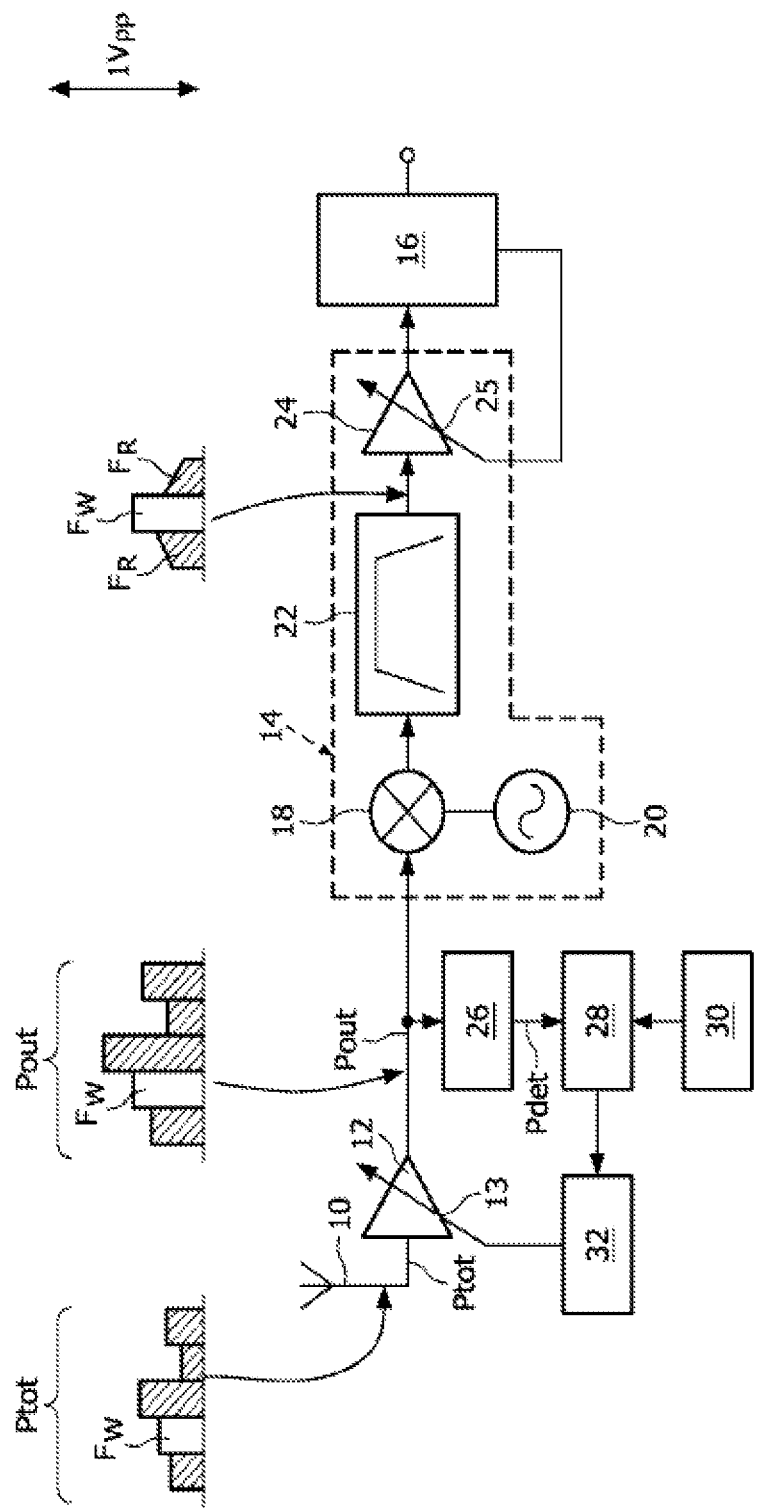
FIG. 1 shows a known radio frequency receiver including two feedback gain control loops.
Figure 2:
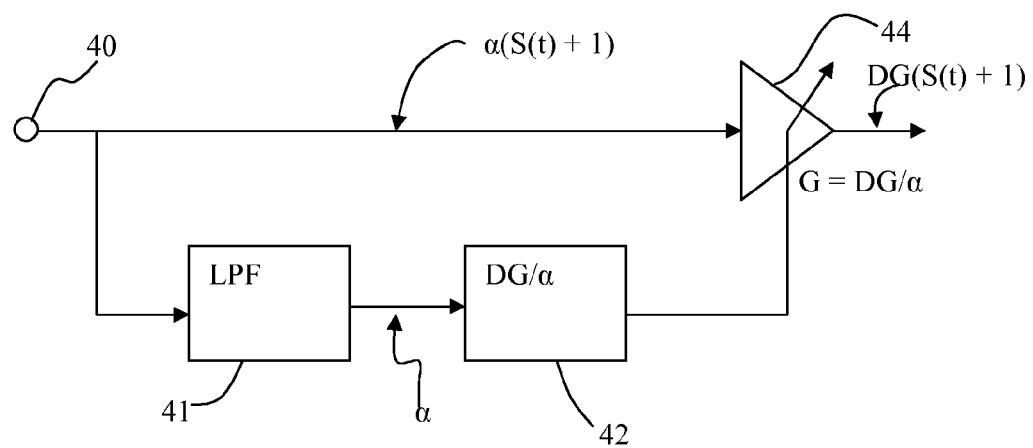
FIG. 2 shows a first example of circuit of the invention.

FIG. 2 shows a circuit of the invention.

The circuit comprises an input 40 for receiving the variably attenuated input signal described above, as expressed by equation [1].

A feedforward path comprises a low pass filter 41 for deriving the level of attenuation $\alpha$ from the attenuated dc reference level part of the variably attenuated input signal, and a unit 42 for deriving a multiplier value, based on the reciprocal of the level of attenuation $\alpha$.

This multiplier value G is then used by a multiplier 44 (a variable gain amplifier) to multiply the variably attenuated input signal to derive an output signal comprising a constant multiple DG of the input signal. In the example outlined above, the desired gain DG=0.35.

As shown, a fully feedforward system is possible to determine the required gain.

In this feedforward system, a higher order filtering can be applied to determine the average (low pass filtered) signal level. The higher the order of the filtering, the lower the distortion caused by inter-modulation of the input signal with the measured average.

It is possible to make the filtering virtually non-causal by inserting a delay between the input signal and the gain that compensates for the signal strength.

The reason why a higher order filter has less distortion is because it can provide a sharp transition between the pass band and stop-band, i.e. a sharp cut-off frequency. The sharp transition can be used either to increase the pass band or to increase the stop band when other factors remain stable. A large pass-band allows for a quick response to changing signal conditions, whereas a low stop-band cut off ensures low inter-modulation.

In car radio conditions, the signal conditions can quickly change and there is a high demand for signal quality, and therefore the bias is towards low inter-modulation. Therefore the increased filter order allowed by the feed forward system will be used to improve these parameters.

The increased bandwidth of the system may still not allow for correct gain correction in conditions of quickly changing input. There are many known methods to determine sudden changes in signal strength, and these can be used to implement a further control.

Under these conditions it is beneficial if the gain adaptation feedforward path speed can temporarily be increased.

Figure 3:
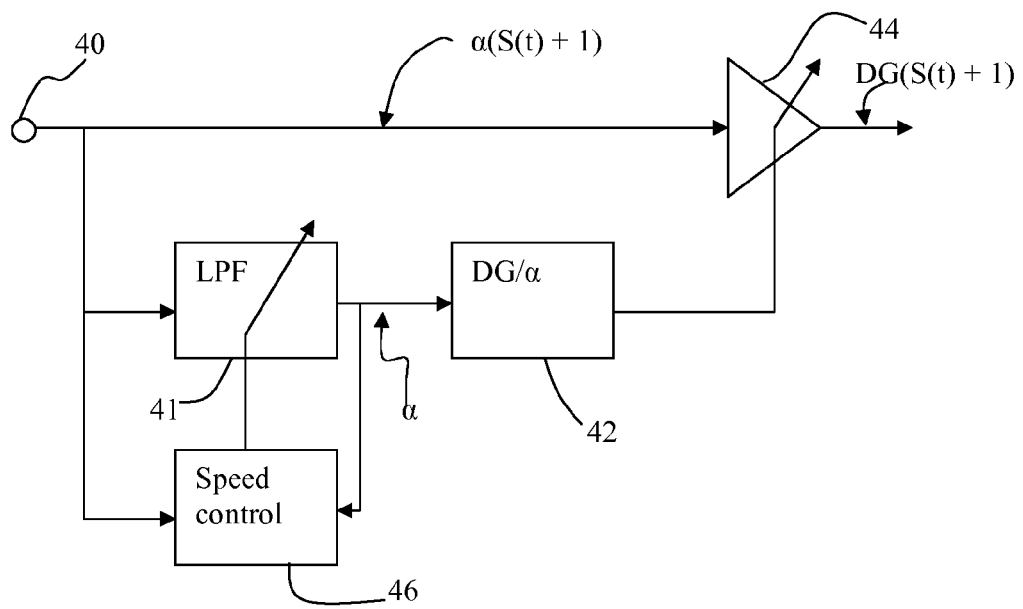
FIG. 3 shows a second example of circuit of the invention.

There are several options to speed up the filtering, including non-linear filtering. One option is shown in FIG. 3.

The same components are present as in FIG. 2, but the low pass filter 41 is adjustable, in that the cut-off frequency is controllable. A speed control circuit 46 is used to detect rapid changes in the input signal level.

The speed of the low pass filter 41 is controlled by the speed control circuit 46. Whenever extreme changes in the input signal level are determined, the system is set such that it can adjust to the new signal condition as fast as possible.

At the moment of sudden changes in the input condition, the gain adjustment no longer has to be inaudible, however the output should still sound as good as possible. The most simple and safe way to increase speed is to extend the averaging bandwidth while the special condition is detected. This means increasing the cut-off frequency of the low pass filter.

In a fully feed forward system as shown, there is no risk of instability caused by the changed bandwidth of the system. This however does not mean that the speed increase can be extreme; the system has to be controlled such that it will not stabilize on low frequency audio.

The system needs to have a reliable amplitude linear filtering at least when not in the speed up mode. The multiplier block 42 has to be linear for the range of interest and certainly must not have any discontinuity.

The method of determining the speed setting of the filter is not described in detail as it is considered that many known algorithms can be used, and many different input signals can be used to determine the optimal speed at any given moment.

The system can be used for all automatic gain correction systems where a reference amplitude is known. One application of interest is AM car radio systems.

Figure 4:
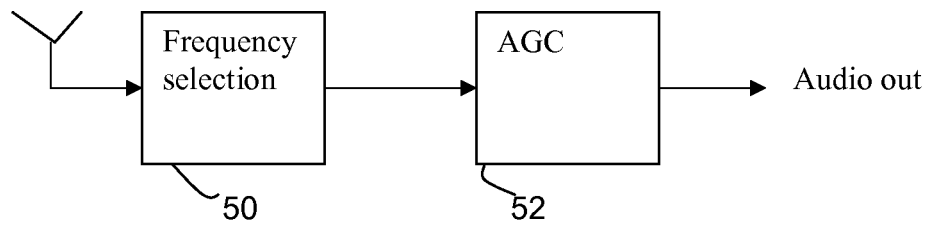
FIG. 4 shows a radio frequency amplitude demodulator circuit.

FIG. 4 shows a radio frequency amplitude demodulator circuit, which comprises a standard frequency selection circuit 50 for selecting an amplitude modulated radio frequency signal, and converting to baseband, an automatic gain control circuit 52 as described above which generates the constant ampliture output signal.

In the example above, the unit (42) for deriving a multiplier value and the multiplier (44) are shown as separate units, but they may of course be integrated into a single unit—in that the low pass filter output can be the control input to a suitably design variable gain amplifier.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:
1. An automatic gain control circuit, comprising:
  an input configured to receive a variably attenuated input signal, the variably attenuated input signal comprising both a dc reference level and a superposed ac data signal;
  a feedforward path comprising:
    a low pass filter configured to derive a level of attenuation from the dc reference level; and
    a unit configured to derive a multiplier value, based on a reciprocal of the level of attenuation; and
  a multiplier configured to multiply the variably attenuated input signal with the multiplier value to derive an output signal comprising a constant multiple of the variably attenuated input signal.
2. The circuit as claimed in claim 1, wherein the multiplier value comprises a desired gain multiplied by the reciprocal of the level of attenuation.
3. The circuit as claimed in claim 2, wherein the desired gain comprises: $DG=V_{max}/(RefDC+PM_{max})$, $V_{max}$ is a maximum desired output voltage, RefDC is a dc reference voltage level, and $PM_{max}$ is a maximum input signal resulting when a maximum positive modulation is superposed on RefDC.
4. The circuit as claimed in claim 3, wherein the desired gain is in a range of 0.3 to 0.5.
5. The circuit as claimed in claim 2, wherein the desired gain is substantially 0.35.
6. The circuit as claimed in claim 1, wherein the multiplier comprises a variable gain amplifier.
7. The circuit as claimed in claim 1, further comprising:
  a controller that is configured to control the low pass filter in response to sudden changes in the variable attenuation.
8. The circuit as claimed in claim 7, wherein the controller comprises:
  an element for varying a cut-off frequency of the low pass filter.
9. The circuit as claimed in claim 7, wherein the controller is a speed control circuit.
10. The circuit as claimed in claim 9, wherein the speed control circuit controls a speed of the low pass filter.
11. A car radio receiver circuit comprising:
  a frequency selection circuit configured to select an amplitude modulated radio frequency signal, and convert the selected signal to baseband; and
  the automatic gain control circuit as claimed in claim 1 configured to derive an output signal from a variably attenuated baseband input signal.
12. The circuit as claimed in claim 1, wherein the superposed ac data signal is amplitude modulated.
13. An automatic gain control method, comprising:
  receiving a variably attenuated input signal, the variably attenuated input signal comprising a dc reference level and a superposed amplitude modulated ac data signal;
  low pass filtering the variably attenuated input signal to derive a level of attenuation from the dc reference level;
  deriving a multiplier value, based on a reciprocal of the level of attenuation; and
  multiplying the variably attenuated input signal with the multiplier value to derive an output signal comprising a constant multiple of the variably attenuated input signal.
14. The method as claimed in claim 13, wherein the multiplier value comprises a desired gain multiplied by the reciprocal of the level of attenuation.

15. The method as claimed in claim 14, wherein the desired gain comprises: $DG=V_{max}/(RefDC+PMmax)$, $V_{max}$ is a maximum desired output voltage, RefDC is a dc reference voltage level, and $PM_{max}$ is a maximum input signal resulting when a maximum positive modulation is superposed on RefDC.

16. The method as claimed in claim 14, wherein the multiplying comprises:
controlling a variable gain amplifier.

17. The method as claimed in claim 14, further comprising:
controlling the low pass filtering in response to sudden changes in the variable attenuation.

18. The method as claimed in claim 17, wherein controlling the low pass filtering comprises:
varying a cut-off frequency of the low pass filter.

* * * * *